(12) United States Patent
McClure et al.

(10) Patent No.: US 6,586,816 B2
(45) Date of Patent: *Jul. 1, 2003

(54) SEMICONDUCTOR STRUCTURES FORMED USING REDEPOSITION OF AN ETCHABLE LAYER

(75) Inventors: Brent A. McClure, Boise, ID (US); Daryl C. New, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/480,905

(22) Filed: Jan. 11, 2000

(65) Prior Publication Data

US 2002/0130349 A1 Sep. 19, 2002

Related U.S. Application Data (62) Division of application No. 09/103,202, filed on Jun. 23, 1998, now Pat. No. 6,027,860, which is a continuation of application No. 08/905,785, filed on Aug. 13, 1997, now Pat. No. 5,792,593.

(51) Int. Cl.$^7$ .................. H01L 29/00; H01L 27/108; H01L 29/76; H01L 29/94
(52) U.S. Cl. .............. 257/532; 257/295; 257/296; 257/306; 257/535
(58) Field of Search ............................. 257/303, 306, 257/310, 295–302, 304, 311, 532–536; 438/238–256, 381–399

(56) References Cited

U.S. PATENT DOCUMENTS

| | | | |
|---|---|---|---|
| 4,400,257 A | | 8/1983 | Taylor .................. 204/192 E |
| 4,954,927 A | * | 9/1990 | Park ..................... 361/328 |
| 5,122,923 A | * | 6/1992 | Matsubara ............... 361/321 |
| 5,162,248 A | * | 11/1992 | Dennison et al. ......... 438/253 |
| 5,185,058 A | | 2/1993 | Cathey .................. 156/656 |
| 5,275,974 A | * | 1/1994 | Ellul et al. .............. 438/386 |
| 5,293,510 A | * | 3/1994 | Takenaka ................ 257/295 |
| 5,320,981 A | | 6/1994 | Blalock ................. 437/195 |
| 5,330,614 A | | 7/1994 | Ahn .................... 156/631 |
| 5,335,138 A | * | 8/1994 | Sandhu et al. ........... 361/303 |
| 5,354,705 A | | 10/1994 | Mathews et al. ........... 437/52 |
| 5,436,477 A | * | 7/1995 | Hashizume et al. ........ 257/310 |
| 5,438,010 A | * | 8/1995 | Saeki ..................... 437/52 |
| 5,438,011 A | | 8/1995 | Blalock et al. ............ 437/52 |
| 5,442,212 A | * | 8/1995 | Eimori .................. 257/303 |
| 5,451,543 A | | 9/1995 | Woo et al. ............... 437/195 |
| 5,488,011 A | * | 1/1996 | Figura et al. ............. 437/60 |
| 5,604,696 A | * | 2/1997 | Takaishi ................. 365/149 |
| 5,748,521 A | * | 5/1998 | Lee ..................... 365/149 |
| 5,792,593 A | | 8/1998 | McClure et al. ........... 430/314 |
| 5,808,855 A | * | 9/1998 | Chan et al. .............. 361/321.4 |
| 5,885,864 A | * | 3/1999 | Ma ..................... 438/253 |
| 5,889,300 A | * | 3/1999 | Figura et al. ............. 257/303 |
| 5,998,256 A | * | 12/1999 | Juengling ............... 438/253 |

FOREIGN PATENT DOCUMENTS

| | | | | |
|---|---|---|---|---|
| DE | 4413152 | | 10/1994 | ......... H01L/27/108 |
| EP | 595360 | | 5/1994 | ......... H01L/21/82 |
| GB | 2110876 | | 6/1993 | ......... H01L/21/316 |
| JP | 363211740 A | * | 9/1988 | ................. 438/102 |

OTHER PUBLICATIONS

"Field–Effect Transistor", *IBM technical Disclosure Bulletin*, 28 (6), pp. 2684–2686, (Nov. 1985).

* cited by examiner

Primary Examiner—Shouxiang Hu
(74) Attorney, Agent, or Firm—Schwegman, Lundberg, Woessner & Kluth, P.A.

(57) ABSTRACT

Semiconductor structures formed using redeposition of an etchable layer. A starting material is etched and redeposited during the etch on a sidewall of a foundation. The foundation may be removed or may form an integral part of the structure. The starting material may contain one or more layers of material. The structures are adapted for a variety of capacitor structures.

17 Claims, 6 Drawing Sheets

SEMICONDUCTOR STRUCTURES FORMED USING REDEPOSITION OF AN ETCHABLE LAYER

This application is a divisional of U.S. application Ser. No. 09/103,202, filed Jun. 23, 1998, now U.S. Pat. No. 6,027,860 which is a continuation of U.S. application Ser. No. 08/905,785, filed Aug. 13, 1997, now U.S. Pat. No. 5,792,593.

FIELD OF THE INVENTION

The invention relates to the fabrication of semiconductors and more particularly to the fabrication of a structure formed by redepositing a starting material.

BACKGROUND OF THE INVENTION

Sidewall passivation occurs during a chemical deposition on sidewalls of a structure. Typically, sidewall passivation is used to enhance a mask in order to increase the integrity of the mask thereby eliminating undercut and other etching defects caused when portions of the mask itself are consumed during an etch. The chemical deposit is then typically removed since it is used to perform the process and is not a structural goal of the total process.

SUMMARY OF THE INVENTION

The invention is a method for forming a structure wherein a starting material is etched and redeposited during the etch on a sidewall of a foundation. In one embodiment the foundation is removed subsequent to the etch to leave the redeposited starting material and unetched starting material to form the structure. This structure may be a capacitor electrode. In this embodiment a capacitor may be formed by forming a dielectric layer and a conductive layer overlying the structure.

In a second embodiment the foundation may form an integral part of the final structure. In this case a capacitor can be formed by depositing a dielectric and a conductive layer overlying the structure.

In still a further embodiment a capacitor may be formed using a single etch wherein redeposition occurs during the single etch. In this case two conductive layers are formed overlying a substrate and a dielectric layer is formed interposed between the conductive layers. The etch is performed after masking of the layers with a foundation. The etch creates particles or portions of each layer which are then deposited on a sidewall of the foundation to create the capacitor.

When a photoresist mask is used as the foundation the size of the structure made by the method of the invention is determined only by photolithography limits. The smallest size mask definable by lithography may be used for forming the container cell.

DETAILED DESCRIPTION OF THE INVENTION

The invention is a method for forming a structure by redepositing a deposited material during an etch of the deposited material.

The redeposit is mechanical in that the etch accelerates particles of the deposited material some of which bombard sidewalls of a foundation provided to create a base on which the accelerated particles can form the redeposited material. Thus the redeposited material has the same chemical composition as the originally deposited (or formed) material.

Figure 1:
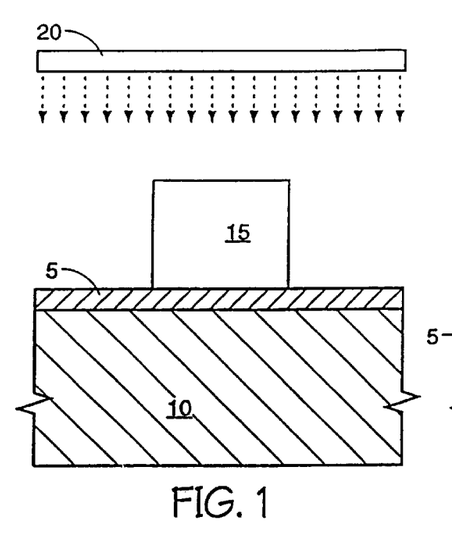
FIG. 1 is a cross-sectional view of a masked portion of a substrate having a starting material and positioned in an etching environment

In one embodiment shown in FIG. 1 a starting material 5 is deposited to overlie a substrate 10. In a preferred embodiment the starting material 5 is platinum although other materials such as TiPt, TiNPt, r, TiAlN—Pt Ru, $RuO_2$, RuPt, $RuO_2$Pt, W, WPt, WSi, TiSi, Ta, TaN, TaSi, doped and undoped Poly Si, Al, Pd and Ir may be used. A foundation 15 is formed overlying the starting material 5. In this embodiment the foundation 15 is a photoresist mask the size of which is limited only by photolithic techniques. Although the foundation 15 shown in the accompanying drawings is rectangular any shape may be formed. The starting material 5 is etched in an argon plasma environment at radio frequencies using an Ion Mill etcher as an RF ion source 20. Etching with argon in an Ion Mill etcher is well known to those skilled in the art. It is also possible to use other materials as etchants.

Figure 2:
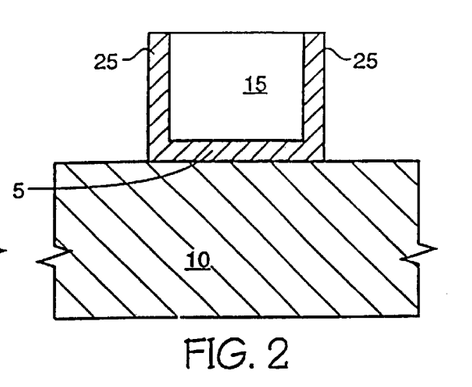
FIG. 2 is the portion of the substrate shown in FIG. 1 following an etch and redeposit of the starting material.

During etching portions of the starting material 5, in this case platinum, are redeposited as portions 25 on the sidewalls of the foundation 15, see FIG. 2. Typically, the angle of incidence between the starting material 5 and the trajectory of an accelerated etchant ion is selected to maximize the amount of redeposition of the starting material 5 on the sidewalls of the foundation 15. A 90 degree angle of incidence typically works well.

Figure 3:
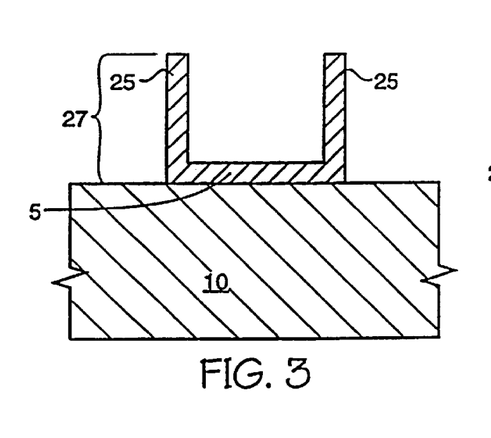
FIG. 3 is the portion of the substrate shown in FIG. 2 following the removal of the mask.
Figure 4:
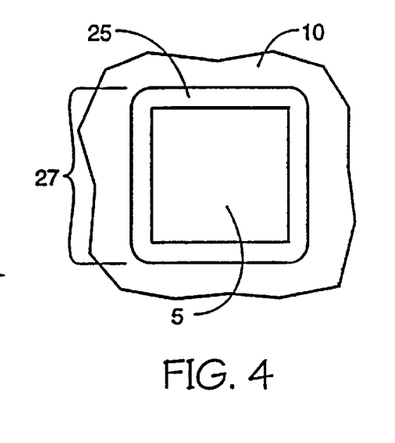
FIG. 4 is a top planar view of the portion of the substrate shown in FIG. 3.

In FIGS. 3 and 4 the photoresist has been striped leaving the structure 27 comprising platinum portions 5 and 25 formed by the method of the invention.

The platinum structure 27 may be used as a storage node electrode for a container cell capacitor. In this case the process is continued, as shown in FIGS. 5 and 6, in order to complete the capacitor fabrication.

Figure 5:
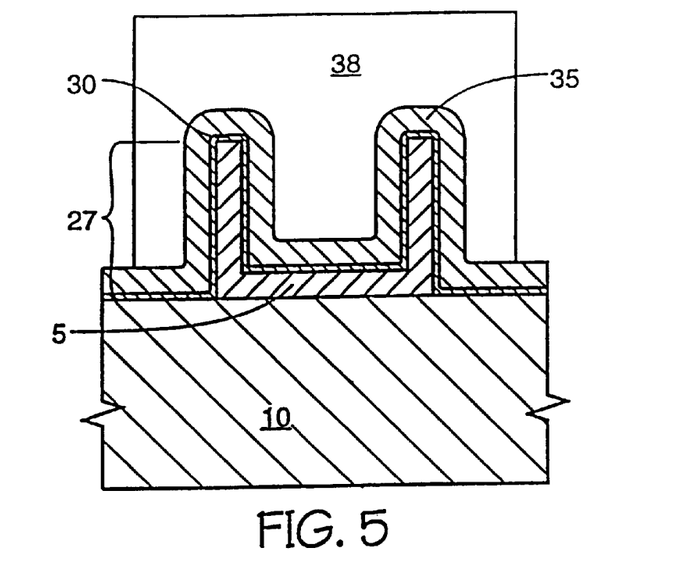
FIG. 5 is the portion of the substrate and the structure shown in FIG. 3 following the formation of a dielectric layer, a conductive layer and a mask
Figure 6:
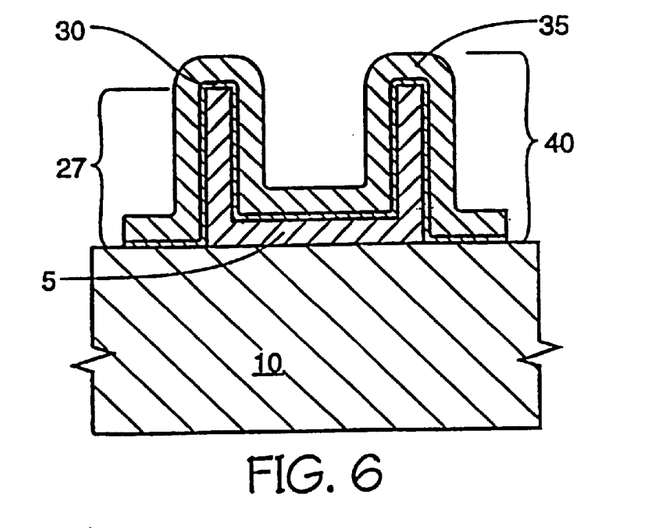
FIG. 6 is the portion of the substrate and the structure shown in FIG. 5 following an etch of the dielectric layer and the conductive layer and following the removal of the mask

In FIG. 5 a dielectric layer 30 has been deposited to overlie the platinum structure 27. This deposition is followed by the deposition, typically a sputtering, of a conductive layer 35 to overlie the dielectric layer 30. The dielectric layer 30 and the conductive layer 35 are then patterned with mask 38. The dielectric layer 30 and the conductive layer 35 are etched according to means known to those skilled in the art to form the capacitor 40 shown in FIG. 6.

In a case where Osmium, Iridium, or Ruthenium is used in place of Platinum, the structures formed by the process of the invention may be oxidized thereby forming $OsO_x$, $IrO_2$ or $RuO_2$ respectively.

Figure 7:
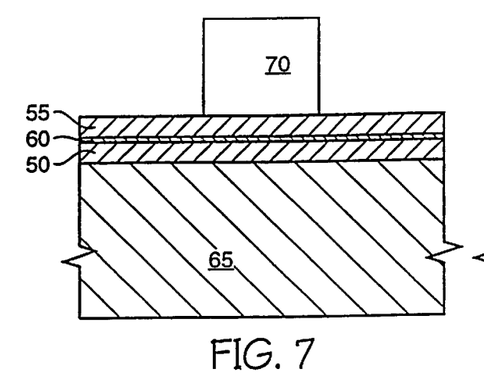
FIG. 7 is a cross-sectional view of a portion of a substrate and masked conductive layers interposed with a dielectric layer.
Figure 8:
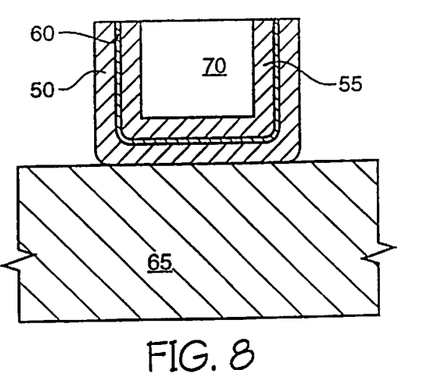
FIG. 8 is the portion of the substrate shown in FIG. 7 following etching and redeposition of the conductive layers and the dielectric layer.
Figure 9:
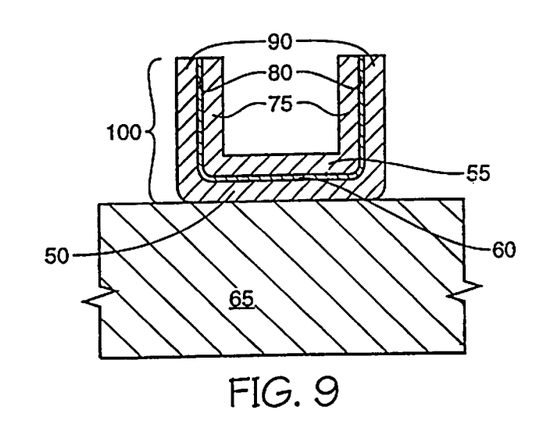
FIG. 9 is the cross sectional view of the portion of the substrate shown in FIG. 8 following the removal of the mask.

In a further embodiment, shown in FIGS. 7–9, tree starting materials, two conductive layers 50 and 55 having a dielectric layer 60 interposed therein, are deposited overlying a substrate 65 (see FIG. 7). The conductive layers 50 and 55 are patterned with a foundation 70, typically a photoresist mask, and then the conductive layers 50 and 55 and the dielectric layer 60 are etched insitu, typically using a single etch step.

In FIG. 8, as conductive layer 55 is etched it is redeposited on the sidewalls of the foundation 70 to form a vertical conductive (to the substrate) layer 75. The etch continues and the dielectric layer 60 is redeposited to form a vertical-dielectric layer 80. The etch further continues to etch conductive layer 50 which is redeposited during the etch as vertical conductive layer 90. Among the appropriate materials for the conductive layers 50 and 55 are platinum, conductive oxides, and polysilicon. The redeposited layers 75 and 90 are the same material as the original conductive layers 50 and 55. Therefore if 50 and 55 are platinum the redeposited layers 75 and 90 are also platinum. The same is true of the dielectric layer. Dielectric layer 60 may be chosen from a group of dielectrics selected from the group consisting of $Ba(1-x)SrxO_3$, $PbZr(1-x)TixO_3$, PZT with various dopants such as LA etc., $Sr(1-x)BixTaO_3$, $Sr(1-x)BixTiO_3$ and all of the other Smolenski compounds, $PbMg(1-x)NbxTiO_3$ (PMN), compounds with $PbTiO_3$ (PMN-PT), $CaBi_2Nb_2O_9$, $SrBi_2Nb_2O_9$, $BaBi_2Nb_2O_9$, $PbBi_2Nb_2O_9$, $BiBi_2NbTiO_9$, $BaBi_4Ti_4O_{15}$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, $PbBi_4Ti_4O_{15}$, (Pb, Sr)$Bi_2Nb_2O_9$, (Pb, Ba)$Bi_2Nb_2O_9$, (Ba, Ca)$Bi_2Nb_2O_9$(Ba, Sr)$Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{1.5}O_9$, $Ba_{0.25}Bi_{2.75}Ti_{0.75}Nb_{125}O_9$, $Bi_3TiNbO_9$, $SrBi_2Nb_2O_9$, $Sr_{0.8}Bi_{2.2}Ti_{0.2}Nb_{1.80O9}$, $Sr_{0.6}Bi_{2.4}Ti_{0.4}Nb_{1.6}O_9$, $Bi_3TiNb_9$, $PbBi_2Nb_2O_9$, $Pb_{0.75}$, $Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{125}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$, and $Bi_5Ti_3GaO_{15}$. Although it is desirable, in order to minimize processing steps, to use only one etchant and only etch step it is possible to perform the method of the invention using multiple etchants or multiple etch steps.

As in the previous embodiment the foundation 70 is removed using conventional methods, see FIG. 9. The structure 100 of the invention remains. In this case the structure 100 is a storage cell capacitor formed using a single etch process performed in an argon plasma environment at radio frequencies using an Ion Mill etcher as an RF ion source wherein the angle of incidence is 90 degrees. Variations of this etch, including etchants and angle of incidence, may be used as long as the desired sidewall deposition occurs during the etch.

Figure 10:
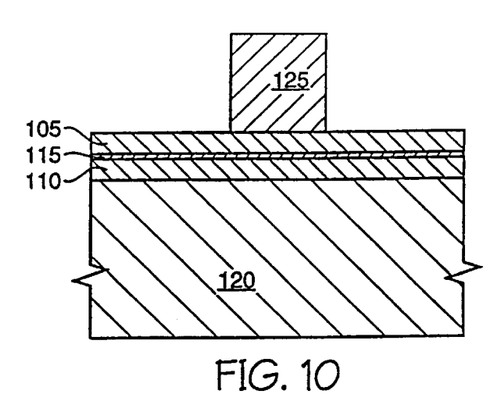
FIG. 10 is a cross-sectional view of conductive layers interposed with a dielectric layer and masked with a conductive plug and overlying a portion of a substrate.
Figure 11:
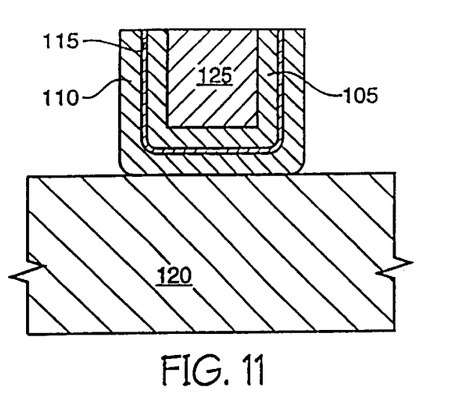
FIG. 11 is the portion of the substrate of FIG. 10 following an etch and redeposition of the conductive layers and the dielectric layer.

In still a further embodiment, as shown in FIGS. 10 and 11, two conductive layers 105 and 110, interposed with a deposited dielectric layer 115, are deposited to overlie a substrate 120. A conductive plug 125 is fabricated by conventional means to overlie conductive layer 105. A polysilicon plug is one preferred choice for the conductive plug 125 however the conductive plug 125 may be of a material selected from the group consisting of TiPt, TiNPt, TiAlN—Pt, Ru, $RuO_2$, RuPt, $RuO_2Pt$, W, WPt, WSi, Ti, TiSi, Ta, TaN, TaSi, doped and undoped Poly Si, Al, Pd and Ir. Other conductive materials may be used as well.

FIG. 11 shows the redeposition of the conductive layers 105 and 110 and the redeposition of dielectric layer 115 following an etch of the layers 105, 110, and 115. A storage node capacitor 130 is formed during the redeposition. The storage node capacitor 130 has conductive layer 110 as a storage node electrode and has conductive layer 105 and conductive plug 125 as a cell plate electrode.

Figure 12:
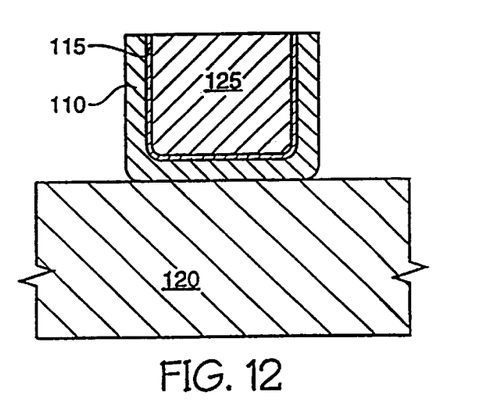
FIG. 12 is a cross-sectional view of a dielectric layer and a conductive layer redeposited on a sidewall of a conductive plug.
Figure 13:
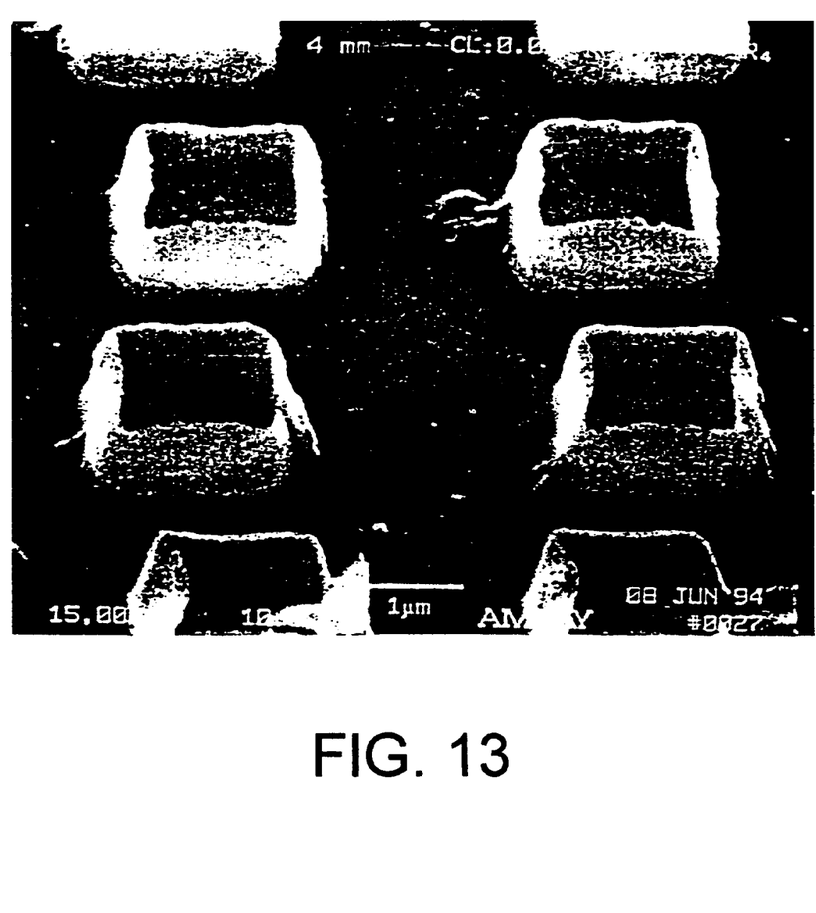
FIG. 13 is a colored copy of a photograph taken with a scanning electron microscope showing an isometric view of a structure of the invention.
Figure 14:
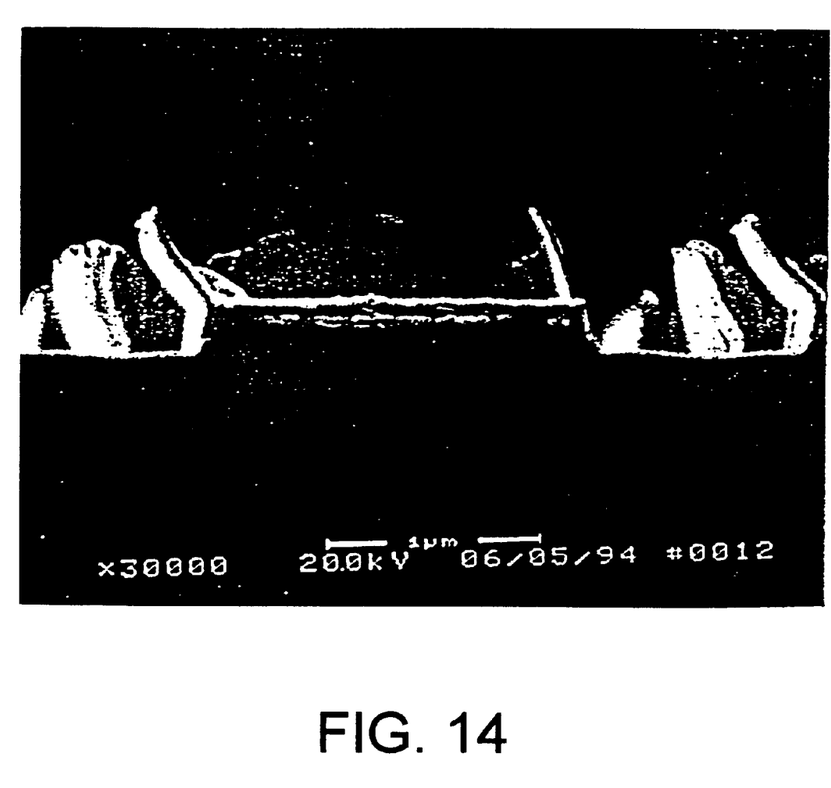
FIG. 14 is a colored copy of a photograph taken with a scanning electron microscope showing a cross-sectional view of a structure of the invention Similar structures of the invention can be seen in the background.

In an alternate embodiment the deposition of conductive layer 105 may be eliminated. The storage node electrode thus formed has conductive layer 110 as the storage node electrode and has the conductive plug 125 as the cell plate electrode, see FIG. 12.

While the invention has been described in its preferred embodiments it is to be understood that the words which have been used are words of description rather than limitation and that changes may be made within the purview of the appended claims without departing from the true scope and spirit of the invention in its broader aspects.

What is claimed is:

1. A capacitor, comprising:

a bottom electrode formed from a first conductive layer;

a capacitor dielectric film completely interior to the bottom electrode and formed from a dielectric layer;

a top electrode formed from a second conductive layer;

wherein the first conductive layer is formed overlying a substrate, the dielectric layer is formed overlying the first conductive layer and the second conductive layer is formed overlying the dielectric layer;

further wherein a patterned foundation is formed overlying the second conductive layer, particles of exposed portions of the second conductive layer are accelerated, and a portion of the accelerated particles of the second conductive layer are redeposited upon sidewalls of the patterned foundation to form a sidewall portion of said top electrode during a single etch process;

still further wherein particles of exposed portions of the dielectric layer are accelerated, and a portion of the accelerated particles of the dielectric layer arc redeposited upon the portion of redeposited particles of the second conductive layer to form a sidewall portion of said capacitor dielectric film during the single etch process; and still further wherein particles of exposed portions of the first conductive layer are accelerated, and a portion of the accelerated particles of the first conductive layer are redeposited upon the portion of redeposited particles of the dielectric layer to form a sidewall portion of said bottom electrode during the single etch process.

2. The capacitor of claim 1, wherein the patterned foundation comprises a photoresist mask.

3. The capacitor of claim 2, wherein the patterned foundation comprises a rectangular pattern.

4. The capacitor of claim 1, wherein the first conductive layer comprises Pt.

5. The capacitor of claim 1, wherein the second conductive layer comprises Pt.

6. The capacitor of claim 1, wherein the first conductive layer comprises a conductive material selected from the group consisting of Pt, conductive oxides and polysilicon.

7. The capacitor of claim 1, wherein the dielectric layer comprises a dielectric selected from the group consisting of $Ba_{(1-x)}Sr_xO_3$, $PbZr_{(1-x)}Ti_xO_3$, doped PZT, $Sr_{(1-x)}Bi_xTaO_3$, $Sr_{(1-x)}Bi_xTiO_3$, Smolenski compounds, $PbMg_{(1-x)}Nb_xTiO_3$ (PMN), $PbTiO_3$(PMN-PT), $CaBi_2Nb_2O_9$, $BiBi_2NbTiO_9$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, (Pb, Sr)$Bi_2Nb_2O_9$, (Pb, Ba)$Bi_2Nb_2O_9$, (Ba, Ca)$Bi_2Nb_2O_9$, (Ba, Sr)$Bi_2Nb_2O_9$, $BaBi_2Nb_2O_9$, $Ba_{0.75}Bi_{2.25}Ti_{0.25}Nb_{1.75}O_9$, $Ba_{0.5}B_{2.5}Ti_{0.5}Nb_{15}O_9$, $Ba_{0.25}Bi_{2.75}Ti_{0.75}Nb_{1.25}O_9$, $SrBi_2Nb_2O_9$, $Sr_{0.8}Bi_{2.2}Ti_{0.2}Nb_{1.8}O_9$, $Sr_{0.8}Bi_{2.4}Ti_{0.4}Nb_{1.6}O_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{1.5}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$ and $Bi_3Ti_3GaO_{15}$.

8. The capacitor of claim 1, wherein the second conductive layer comprises a material selected from the group consisting of Pt, conductive oxides and polysilicon.

9. A storage cell capacitor, comprising:
a first capacitor electrode timed from a first conductive layer;
a capacitor dielectric film completely interior to the first capacitor electrode and formed from a dielectric layer;
a second capacitor electrode formed from a second conductive layer;
wherein the first conductive layer is formed overlying a substrate, the dielectric layer is formed overlying the first conductive layer and the second conductive layer is formed overlying the dielectric layer;
further wherein a patterned foundation is formed overlying the second conductive layer, particles of exposed portions of the second conductive layer are accelerated during a single etch process, and a portion of the accelerated particles of the second conductive layer are redeposited upon sidewalks of the patterned foundation to form a sidewall portion of said second capacitor electrode;
still further wherein particles of exposed portions of the dielectric layer are accelerated during the single etch process, and a portion of the accelerated particles of the dielectric layer are redeposited upon the portion of redeposited particles of the second conductive layer to form a sidewall portion of said capacitor dielectric film;
still further wherein particles of exposed portions of the first conductive layer are accelerated during the single etch process, and a portion of the accelerated particles of the first conductive layer are redeposited upon the portion of redeposited particles of the dielectric layer to form a sidewall portion of said first capacitor electrode; and
still further wherein the patterned foundation is removed.

10. A storage node capacitor, comprising:
a first electrode formed from a conductive layer;
a capacitor dielectric film completely interior to the first electrode and formed from a dielectric layer;
a second electrode formed of a patterned foundation;
wherein the conductive layer is formed overlying a substrate, the dielectric layer is formal overlying the conductive layer, and the patterned foundation is formed overlying the dielectric layer;
further wherein particles of exposed portions of the dielectric layer are accelerated and a portion of the accelerated particles of the dielectric layer are redeposited upon sidewalls of the patterned foundation to form a sidewall portion of said capacitor dielectric film during a single etch process; and
still further wherein particles of exposed portions of the conductive layer are accelerated and a portion of the accelerated particles of the conductive layer are redeposited upon the portion of redeposited particles of the dielectric layer to form a sidewall portion of said first electrode during the single etch process.

11. The storage node capacitor of claim 10, wherein the conductive layer comprises a material selected from the group consisting of Pt, conductive oxides and polysilicon.

12. The storage node capacitor of claim 10, wherein the dielectric layer comprises a dielectric selected from the group consisting of $Ba_{(1-x)}Sr_xO_3$, $PbZr_{(1-x)}Ti_xO_3$, doped PZT, $Sr_{(1-x)}Bi_xTaO_3$, $Sr_{(1-x)}Bi_xTiO_3$, Smolenski compounds, $PbMg_{(1-x)}Nb_xTiO_3$(PMN, $PbTiO_3$(PMN-PT), $CaBi_2Nb_2O_9$, $BiBi_2NbTiO_9$, $CaBi_2Ta_2O_9$, $SrBi_2Ta_2O_9$, $BaBi_2Ta_2O_9$, $PbBi_2Ta_2O_9$, $Bi_4Ti_3O_{12}$, $SrBi_4Ti_4O_{15}$, $BaBi_4Ti_4O_{15}$, (Pb, Sr)$Bi_2Nb_2O_9$, (Pb, Ba)$Bi_2Nb_2O_9$, (Ba, Ca)$Bi_2Nb_2O_9$, (Ba, Sr)$Bi_2Nb_2O_9$, $BaBi_2Nb_2O_9$, $Ba_{0.75}Bi_{2.25}Ti_{0.25}Nb_{1.75}O_9$, $Ba_{0.5}Bi_{2.5}Ti_{0.5}Nb_{15}O_9$, $Ba_{0.25}Bi_{2.75}Ti_{0.75}Nb_{1.25}O_9$, $SrBi_2Nb_2O_9$, $Sr_{0.8}Bi_{2.2}Ti_{0.2}Nb_{1.8}O_9$, $Sr_{0.6}Bi_{2.4}Ti_{0.4}Nb_{1.6}O_9$, $PbBi_2Nb_2O_9$, $Pb_{0.75}Bi_{2.25}Ti_{0.25}Nb_{1.75}O_9$, $Pb_{0.5}Bi_{2.5}Ti_{0.5}Nb_{15}O_9$, $Pb_{0.25}Bi_{2.75}Ti_{0.75}Nb_{1.25}O_9$, $Bi_3TiNbO_9$, $PbBi_4Ti_4O_{15}$, $Pb_{0.75}Bi_{4.25}Ti_{3.75}Ga_{0.25}O_{15}$, $Pb_{0.5}Bi_{4.5}Ti_{3.5}Ga_{0.5}O_{15}$ and $Bi_3Ti_3GaO_{15}$.

13. The storage node capacitor of claim 10, wherein the particles of exposed portions are accelerated by etching the exposed portions with an RF ion source.

14. The storage node capacitor of claim 10, wherein the patterned foundation comprises a conductive material selected from the group consisting of Pt, TiPt, TiNPt, TiANlN-Pt, Ru, $RuO_2$, RuPt, $RuO_2$Pt, W, WPt, WSi, Ti, TiSi, Ta, TaN, TaSi, doped polysilicon, undoped polysilicon, Al, Pd and Ir.

15. A capacitor, comprising:
a first electrode formed from a first conductive layer;
a capacitor dielectric film completely interior to the first electrode and formed from a dielectric layer;
a second electrode formed from a second conductive layer;
wherein the first conductive layer is formed overlying a substrate, the dielectric layer is formed overlying the first conductive layer and the second conductive layer is formed overlying the dielectric layer;
further wherein a patterned foundation is formed overlying the second conductive layer, particles of exposed portions of the second conductive layer are accelerated by etching the exposed portions of the second conductive layer with an RF ion source, and a portion of the accelerated particles of the second conductive layer are redeposited upon sidewalls of the patterned foundation to form a sidewall portion of said second electrode during a single etch process;

still further wherein particles of exposed portions of the dielectric layer are accelerated by etching the exposed portions of the dielectric layer with an RF ion source, and a portion of the accelerated particles of the dielectric layer are redeposited upon the portion of redeposited particles of the second conductive layer to form a sidewall portion of dais capacitor dielectric film during the single etch process; and still further wherein particles of exposed portions of the first conductive layer are accelerated by etching the exposed portions of the first conductive layer with an RF ion source, and a portion of the accelerated particles of the first conductive layer are redeposited upon the portion of redeposited particles of the dielectric layer to form a sidewall portion of said first electrode during the single etch process.

16. A storage cell capacitor, comprising:

a first electrode formed from a first conductive layer;

a capacitor dielectric film completely interior to the first electrode and formed from a dielectric layer;

a second electrode formed from a second conductive layer;

wherein the first conductive layer is formed overlying a substrate, the dielectric layer is formed overlying the first conductive layer and the second conductive layer is formed overlying the dielectric layer;

further wherein a patterned foundation is formed overlying the second conductive layer, particles of exposed portions of the second conductive layer are accelerated by etching the exposed portions of the second conductive layer with an RF ion source, and a portion of the accelerated particles of the second conductive layer are redeposited upon sidewalls of the patterned foundation to form a sidewall portion of said second electrode during a single etch process;

still further wherein particles of exposed portions of the dielectric layer are accelerated by etching the exposed portions of the dielectric layer with an RF ion source, and a portion of the accelerated particles of the dielectric layer are redeposited upon the portion of redeposited particles of the second conductive layer to form a sidewall portion of said capacitor dielectric film during the single etch process;

still further wherein particles of exposed portions of the first conductive layer are accelerated by etching the exposed portions of the first conductive layer with an RF ion source, and a portion of the accelerated particles of the first conductive layer arc redeposited upon the portion of redeposited particles of the dielectric layer to form a sidewall portion of said first electrode during the single etch process; and still further wherein the patterned foundation is removed.

17. A storage node capacitor, comprising:

a first electrode formed from a conductive layer;

a capacitor dielectric film completely interior to the first electrode and formed from a dielectric layer;

a second electrode formed of a patterned foundation;

wherein the conductive layer is formed overlying a substrate, the dielectric layer is formed overlying the conductive layer, and the patterned foundation is formed overlying the dielectric layer;

further wherein particles of exposed portions of the dielectric layer are accelerated by etching die exposed portions of the dielectric layer with an RF ion source, and a portion of the accelerated particles of the dielectric layer are redeposited upon sidewalls of the patterned foundation to form a sidewall portion of said capacitor dielectric film during a single etch process; and still further wherein particles of exposed portions of the conductive layer are accelerated by etching the exposed portions of the conductive layer with an RF ion source, and a portion of the accelerated particles of the conductive layer are redeposited upon the portion of redeposited particles of the dielectric layer to form a sidewall portion of said first electrode during the single etch process.

* * * * *

UNITED STATES PATENT AND TRADEMARK OFFICE
CERTIFICATE OF CORRECTION

PATENT NO. : 6,586,816 B2
DATED : July 1, 2003
INVENTOR(S) : Brent A. McClure and Daryl C. New It is certified that error appears in the above-identified patent and that said Letters Patent is hereby corrected as shown below:

Column 2,
Line 49, delete "r," after "TiNPt,".
Line 49, insert -- , -- after "TiAlN-Pt".

Column 3,
Line 46, delete "Ba(1-x)SrxO$_3$" and insert -- Ba$_{(1-x)}$Sr$_x$O$_3$ -- therefor.
Line 46, delete "PbZr(1-x)TixO$_3$" and insert -- PbZr$_{(1-x)}$Ti$_x$O$_3$ -- therefor.
Line 47, delete "Sr(1-x)BixTaO$_3$" and insert -- Sr$_{(1-x)}$Bi$_x$TaO$_3$ -- therefor.
Line 47, delete "Sr(1-x)BixTiO$_3$" and insert -- Sr$_{(1-x)}$Bi$_x$TiO$_3$ -- therefor.
Line 48, delete "PbMg(1-x)NbxTiO$_3$ (PMN)" and insert -- PbMg$_{(1-x)}$Nb$_x$TiO$_3$ (PMN) -- therefor.
Line 56, delete "Ba$_{0.25}$Bi$_{2.75}$Ti$_{0.75}$Nb$_{125}$O$_9$" and insert -- Ba$_{0.25}$Bi$_{2.75}$Ti$_{0.75}$Nb$_{1.25}$O$_9$ -- therefor.
Line 57, delete "Sr$_{0.8}$Bi$_{2.2}$Ti$_{0.2}$Nb$_{1.80}$O$_9$" and insert -- Sr$_{0.8}$Bi$_{2.2}$Ti$_{0.2}$Nb$_{1.8}$O$_9$ -- therefor.
Line 58, delete "," after "Pb$_{0.75}$".
Line 60, delete "Pb$_{0.25}$Bi$_{2.75}$Ti$_{0.75}$Nb$_{125}$O$_9$" and insert -- Pb$_{0.25}$Bi$_{2.75}$Ti$_{0.75}$Nb$_{1.25}$O$_9$ -- therefor.

Column 5,
Line 24, delete "Ba$_{0.5}$B$_{2.5}$Ti$_{0.5}$Nb$_{15}$O$_9$" and insert -- Ba$_{0.5}$Bi$_{2.5}$Ti$_{0.5}$Nb$_{1.5}$O$_9$ -- therefor.
Line 25, delete "Sr$_{0.8}$Bi$_{2.4}$Ti$_{0.4}$Nb$_{1.6}$O$_9$" and insert -- Sr$_{0.6}$Bi$_{2.4}$Ti$_{0.4}$Nb$_{1.6}$O$_9$ -- therefor.
Line 29, delete "Bi$_3$Ti$_3$GaO$_{15}$" and insert -- Bi$_5$Ti$_3$GaO$_{15}$ -- therefor.
Line 34, delete "timed" and insert -- formed -- therefor.

UNITED STATES PATENT AND TRADEMARK OFFICE
CERTIFICATE OF CORRECTION

PATENT NO.    : 6,586,816 B2
DATED         : July 1, 2003
INVENTOR(S)   : Brent A. McClure and Daryl C. New It is certified that error appears in the above-identified patent and that said Letters Patent is hereby corrected as shown below:

Column 6,
Line 38, delete "$Pb_{0.5}Bi_{2.5}Ti_{0.5}Nb_{15}O_9$" and insert -- $Pb_{0.5}Bi_{2.5}Ti_{0.5}Nb_{1.5}O_9$ -- therefor.
Line 38, delete "$Bi_3Ti_3GaO_{15}$" and insert -- $Bi_5Ti_3GaO_{15}$ -- therefor.

Signed and Sealed this

Third Day of February, 2004

JON W. DUDAS
*Acting Director of the United States Patent and Trademark Office*